United States Patent
Takayama et al.

(10) Patent No.: US 7,433,527 B2
(45) Date of Patent: Oct. 7, 2008

(54) TIME SERIES DATA DIMENSIONAL COMPRESSION APPARATUS

(75) Inventors: Shigenobu Takayama, Tokyo (JP); Shinsuke Azuma, Tokyo (JP); Shigeo Sato, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 287 days.

(21) Appl. No.: 10/582,846

(22) PCT Filed: Feb. 26, 2004

(86) PCT No.: PCT/JP2004/002252

§ 371 (c)(1),
(2), (4) Date: Jun. 14, 2006

(87) PCT Pub. No.: WO2005/083890

PCT Pub. Date: Sep. 9, 2005

(65) Prior Publication Data

US 2007/0147519 A1    Jun. 28, 2007

(51) Int. Cl.
*G06K 9/36* (2006.01)
(52) U.S. Cl. .................. 382/239; 382/238; 382/232; 382/249; 382/181; 382/255; 341/50; 341/51; 345/473; 345/474; 702/69; 702/79; 702/113; 702/124; 702/189
(58) Field of Classification Search .............. 382/238, 382/239, 253, 181, 225; 702/69, 79, 189, 702/124, 177, 113; 345/473, 474; 341/50, 341/51
See application file for complete search history.

(56) References Cited

U.S. PATENT DOCUMENTS 5,583,794 A * 12/1996 Shimizu et al. ........... 382/243

(Continued)

FOREIGN PATENT DOCUMENTS

JP          61-285870 A       12/1986

(Continued)

OTHER PUBLICATIONS

K.Chakrabarti et al., Locally Adaptive Dimensionality Reduction for Indexing Large Time Series Databases, ACM Transactions of Database Systems, Jun. 2002, pp. 188-228, vol. 27-No.2.

(Continued)

*Primary Examiner*—Linh V Nguyen
(74) *Attorney, Agent, or Firm*—Birch, Stewart, Kolasch & Birch, LLP

(57) ABSTRACT

A time series data dimensional compression apparatus performing dimensional compression for improving the efficiency of searching for time series data without losing the features of data. The compression is made to a determined dimension so that a larger volume of information may be extracted therein. A time series subsequence generating section (112) generates time series subsequences of a specified segment width into which a plurality of pieces of time series data generated at a time series data generating section (110) are divided. A singular value decomposition processing section (113) performs singular value decomposition on all of the time series subsequences. A dimensional compression time series data generating section (114) generates dimensional compression time series data by using high-order elements of the singular value decomposition as a representative value of the time series subsequence.

4 Claims, 20 Drawing Sheets

U.S. PATENT DOCUMENTS

| | | | | |
|---|---|---|---|---|
| 5,818,463 | A * | 10/1998 | Tao et al. | 345/473 |
| 5,905,814 | A * | 5/1999 | Mochizuki et al. | 382/239 |
| 6,373,986 | B1 * | 4/2002 | Fink | 382/232 |
| 6,486,881 | B2 * | 11/2002 | Hunter et al. | 345/473 |
| 6,609,085 | B1 * | 8/2003 | Uemura et al. | 702/189 |
| 6,757,432 | B2 * | 6/2004 | Hijiri et al. | 382/232 |
| 6,947,045 | B1 * | 9/2005 | Ostermann et al. | 345/473 |
| 7,103,222 | B2 * | 9/2006 | Peker | 382/181 |
| 2004/0260521 | A1 * | 12/2004 | Aggarwal | 702/189 |
| 2005/0002584 | A1 * | 1/2005 | Qian et al. | 382/253 |

FOREIGN PATENT DOCUMENTS

| | | | |
|---|---|---|---|
| JP | 62-25381 A | 2/1987 | |
| JP | 6-139345 A | 5/1994 | |
| JP | 11-28894 A | 10/1999 | |

OTHER PUBLICATIONS

E. Keogh et al., Dimensionality Reduction for Fast Similarity Search in Large Time Series databases, Knowledge Information Databeses, 2000, pp. 263-286 vol. 3-No. 3.

F. Korn et al., Efficiently Supporting Ad HOC Queries in Large Data Sets of Time Sequences, Proceedings of SIGMOD '97, 1997, pp. 289-300.

* cited by examiner

Fig. 9

| TIME SERIES SUBSEQUENCE STARTING POINT | EIGENVALUE ($s_1$) | VALUE OF ELEMENT OF $u_1$ |
|---|---|---|
| 1 | 2904.518 | 0.04495 |
| 2 | 2904.518 | 0.04497 |
| ... | ... | ... |
| r | 2904.518 | 0.04350 |
| ... | ... | ... |
| m-N | 2904.518 | 0.04371 |
| m-N+1 | 2904.518 | 0.04385 |

Fig. 15

| TIME SERIES SUBSEQUENCE STARTING POINT | EIGENVALUE ($s_1$) | VALUE OF ELEMENT OF $u_1$ | EIGENVALUE ($s_2$) | VALUE OF ELEMENT OF $u_2$ |
|---|---|---|---|---|
| 1 | 2904.518 | 0.04495 | 458.845 | -0.05151 |
| 2 | 2904.518 | 0.04497 | 458.845 | -0.05616 |
| ... | ... | ... | ... | ... |
| r150 | 2904.518 | 0.04350 | 458.845 | 0.04443 |
| ... | ... | ... | ... | ... |
| m-N | 2904.518 | 0.04371 | 458.845 | 0.02856 |
| m-N+1 | 2904.518 | 0.04385 | 211.45 | 0.01931 |

Fig. 19

| INTERMEDIATE TIME SERIES STARTING POINT | EIGEN-VALUE ($s_1$) | VALUE OF ELEMENT OF $u_1$ | EIGEN-VALUE ($s_2$) | VALUE OF ELEMENT OF $u_2$ | ... | EIGEN-VALUE ($s_8$) | VALUE OF ELEMENT OF $u_8$ |
|---|---|---|---|---|---|---|---|
| 1 | 2904.518 | 0.04495 | 458.845 | -0.05151 | ... | ... | ... |
| 2 | 2904.518 | 0.04497 | 458.845 | -0.05616 | ... | ... | ... |
| ... | ... | ... | ... | ... | ... | ... | ... |
| 150 | 2904.518 | 0.04350 | 458.845 | 0.04443 | ... | ... | ... |
| ... | ... | ... | ... | ... | ... | ... | ... |
| m-n | 2904.518 | 0.04371 | 458.845 | 0.02856 | ... | ... | ... |
| m-n+1 | 2904.518 | 0.04385 | 211.45 | 0.01931 | ... | ... | ... |

TIME SERIES DATA DIMENSIONAL COMPRESSION APPARATUS

TECHNICAL FIELD

An object of the present invention is to perform dimensional compression without losing the features of data for more efficient search for time series data. More specifically, the present invention does not aim to improve compression efficiency but to compress time series data to a determined dimension and extract a larger volume of information therein.

BACKGROUND ART

Conventional dimensionality reduction techniques on time series data include Piesewise Aggregate Approximation (PAA) that is described in "Dimensionality Reduction for Fast Similarity Search in Large Time Series Databases" by E. Keogh, K. Chakrabarti, M. Pazzani, and Mehrotra in Journal of Knowledge and Information Systems, 2000, for example.

With PAA, time series data is divided into segments, and the mean value of a segment is used as a representative value of the individual segment for time series data compression.

Mean value calculation is simpler than Fourier Transform or Singular Value Decomposition, and can generate dimensional compression time series data at higher speed.

Another conventional technique of dimensional reduction on time series data is a method using singular value decomposition that is described in "Efficiently Supporting Ad Hoc Queries in Large Datasets of Time Sequences" by F. Korn, H. V. Jagadish, and C. Faloutsos in Proceedings of SIGMOD '97, pp 289-300, for example. The method using singular value decomposition does not employ all elements processed by singular value decomposition. Only leading singular values (large singular values) are used for time series data compression.

Dimensional compression by singular value decomposition has the advantage of high search efficiency with better extraction of the shape of data than by any other method.

With dimensionality reduction on image data, a "transform coding system" is disclosed in JP61-285870 as a conventional technology, for example. Image data is divided into blocks and compressed on a block basis. Divided blocks are compressed by using a combination of Discrete Cosine Transform (DCT) and a transform representing a horizontal and vertical angle of gradient of a matrix.

The thus combining two transforms can achieve a higher compression rate for the block-based extraction of the features of blocks and the selection of the optimal transform.

The PAA can achieve a faster dimensional compression by using the mean value of each segment as the representative value of the segment. However, PAA has the following problem when searching for time series data or in similarity search. In the search procedure for time series data, solution candidates are found first in a compression space and then a final solution is searched for among the solution candidates in a real space. Therefore if a large number of solution candidates found in the compression space are not real solutions in the real space, then the search becomes inefficient. The problem of inefficient search of PAA is resulted from insufficient information after compression that is caused by the deformation of a time series by the use of a mean value as the representative value of each segment. With a flat time series, a time series with upward sloping, and a time series with downward sloping, when their mean values are the same, then their values after compression become the same.

The SVD, which extracts the form of data efficiently, is search efficient in the sense of the search efficiency mentioned above. The problem is, however, that singular value decomposition takes a considerable amount of time dealing with a large volume of data, and cannot handle that much data within a realistic time frame.

The "transform coding system" of JP61-285870, which is directed to improve the compression rate, has the following problem when used in search for time series data. The first thing that needs to be done in search for time series data is to compress all segments (blocks) at the same compression rate in order to search for solution candidates in a compression space. With the above-mentioned system, however, the compression rates are different among different blocks.

DISCLOSURE OF THE INVENTION

A time series data dimensional compression apparatus according to the present invention is characterized by including the following elements:

(1) a time series data generating section that generates a plurality of pieces of time series data of a specified length by sliding a start point of time series data at a predetermined interval along a time axis on time series source data that is sequential data measured at a regular interval along the time axis;

(2) a time series subsequence generating section that generates time series subsequences of a specified segment width by which each of the plurality of pieces of time series data is divided;

(3) a singular value decomposition processing section that performs singular value decomposition on all of the divided time series subsequences; and (4) a dimensional compression time series data generating section that generates dimensional compression time series data by using a specified number of high-order elements of the singular value decomposition as a representative value of each of the divided time series subsequences of the specified segment width.

BRIEF DESCRIPTION OF THE DRAWINGS

FIG. 9 shows the content of an SVD result memory section showing a singular value decomposition result.

FIG. 15 shows an SVD result when the SVD result is used up to the second element.

FIG. 19 shows an SVD result when a dimension after compression is the eighth dimension.

BEST MODE FOR CARRYING OUT THE INVENTION

Embodiment 1

Figure 1:
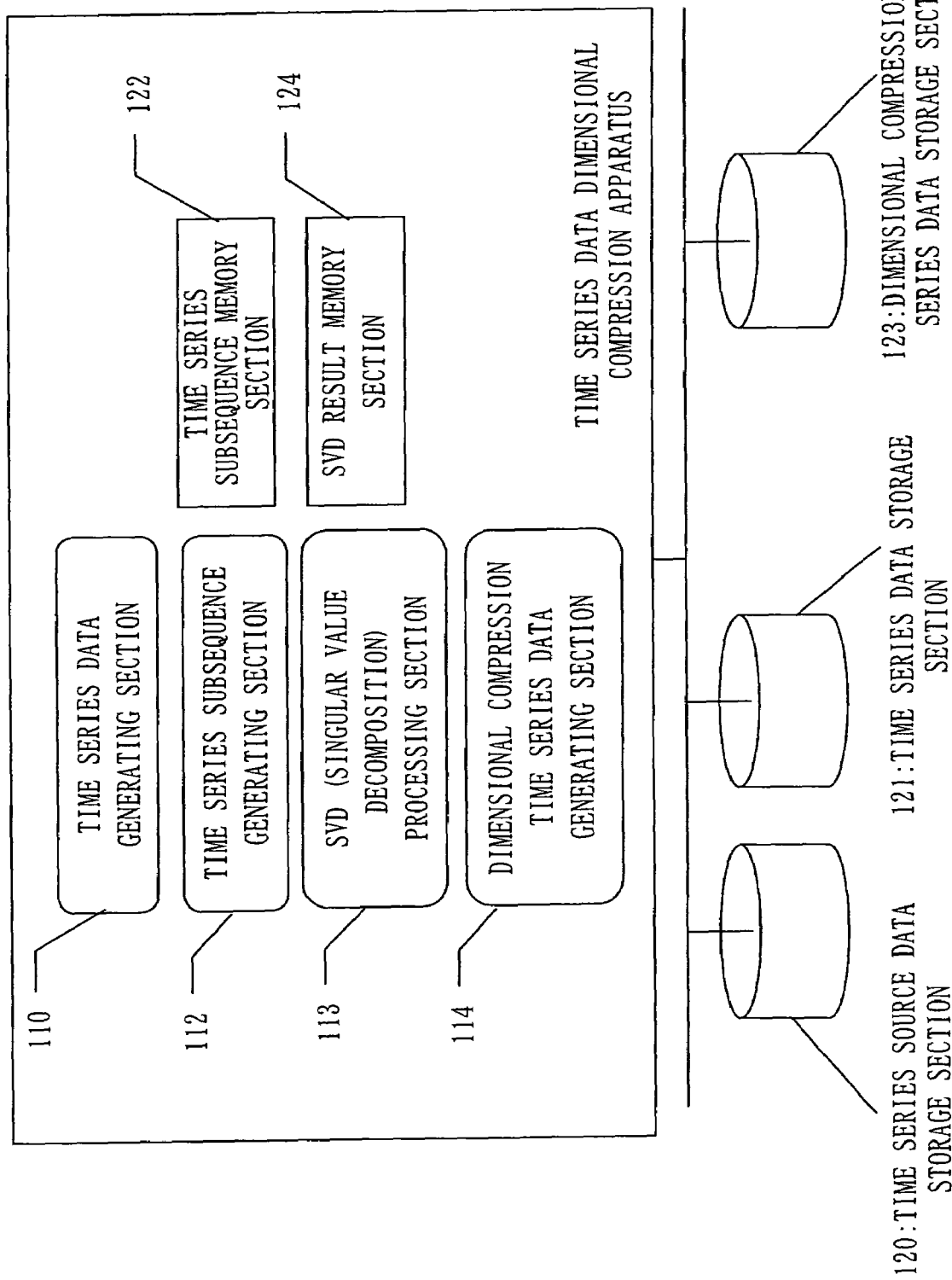
FIG. 1 is a block diagram illustrating a first embodiment of the present invention.

FIG. 1 is a block diagram illustrating an embodiment of the present invention. Referring to the figure, 120 denotes a time series source data storage section, which is a secondary or primary memory unit, for storing time series source data 150. A time series data generating section 110 reads the time series source data 150 from the time series source data storage section 120, and generates time series data 151. A reference numeral 121 denotes a time series data storage section, which is a secondary or primary memory unit, for storing a plurality of pieces of the time series data 151 generated by the time series data generating section 110. A time series subsequence generating section 112 reads the time series data 151 sequentially from the time series data storage section 121, generates a time series subsequence 152, and stores the time series subsequence 152 in a time series subsequence memory section 122. The time series subsequence memory section 122 is a primary or secondary memory unit. An SVD processing section 113 reads the time series subsequence 152 from the time series subsequence memory section 122, performs singular value decomposition, and stores a result in an SVD result memory section 124. The SVD result memory section 124 is a primary or secondary memory unit. A dimensional compression time series data generating section 114 reads an SVD result from the SVD result memory section 124, generates dimensional compression time series data 153, and stores the dimensional compression time series data 153 in a dimensional compression time series data storage section 123. The dimensional compression time series data storage section 123 is a secondary or primary memory unit.

Figure 2:
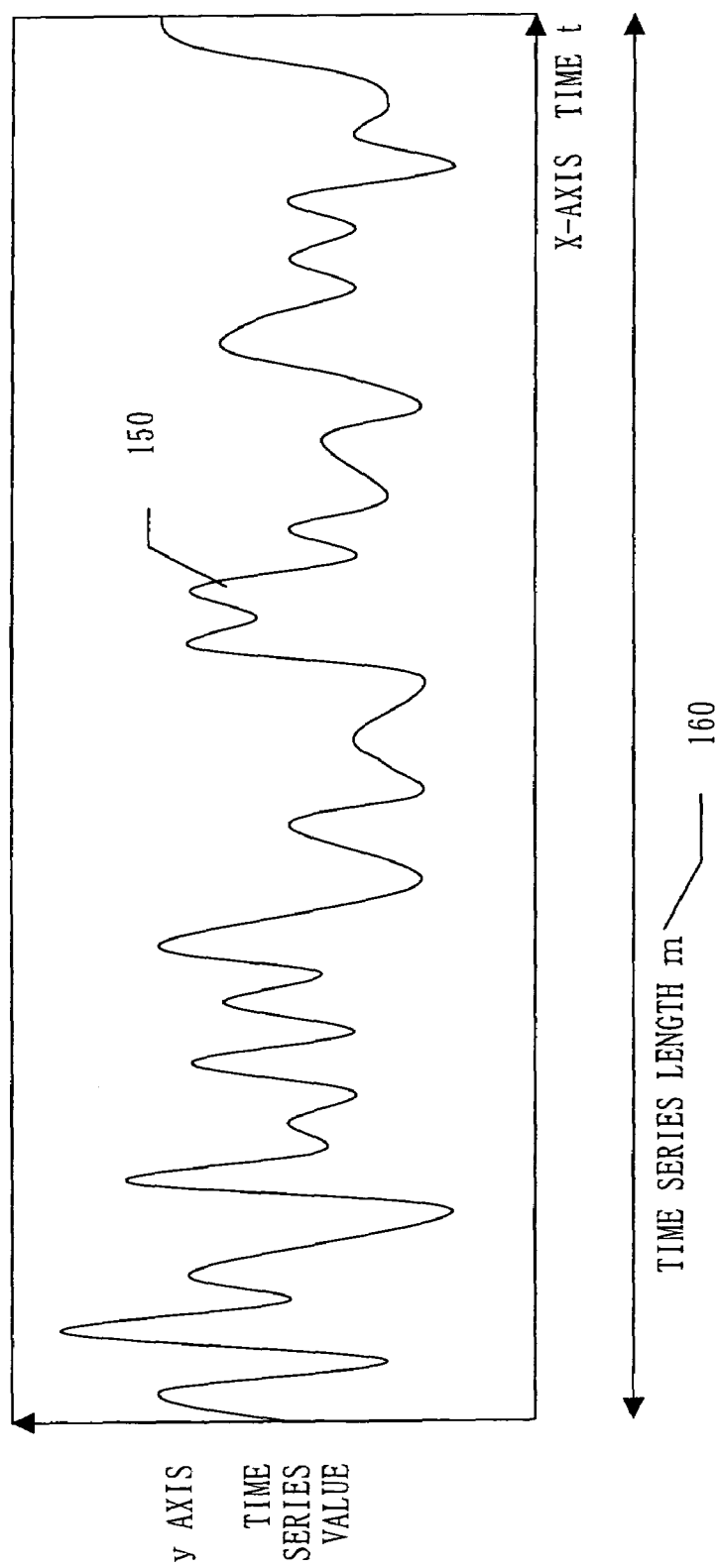
FIG. 2 is a graph showing time series source data 150.

FIG. 2 is a graph of the time series source data 150. The x-axis shows time t, and the y-axis shows the values of a time series. A possible value of the time t is any positive integer between 1 and m. The time series source data 150 contains m data points. The first data point is denoted by t=1, and the last data point is denoted by t=m. The number of data points is called length. Therefore the length of this case is m (time series length 160).

Figure 3:
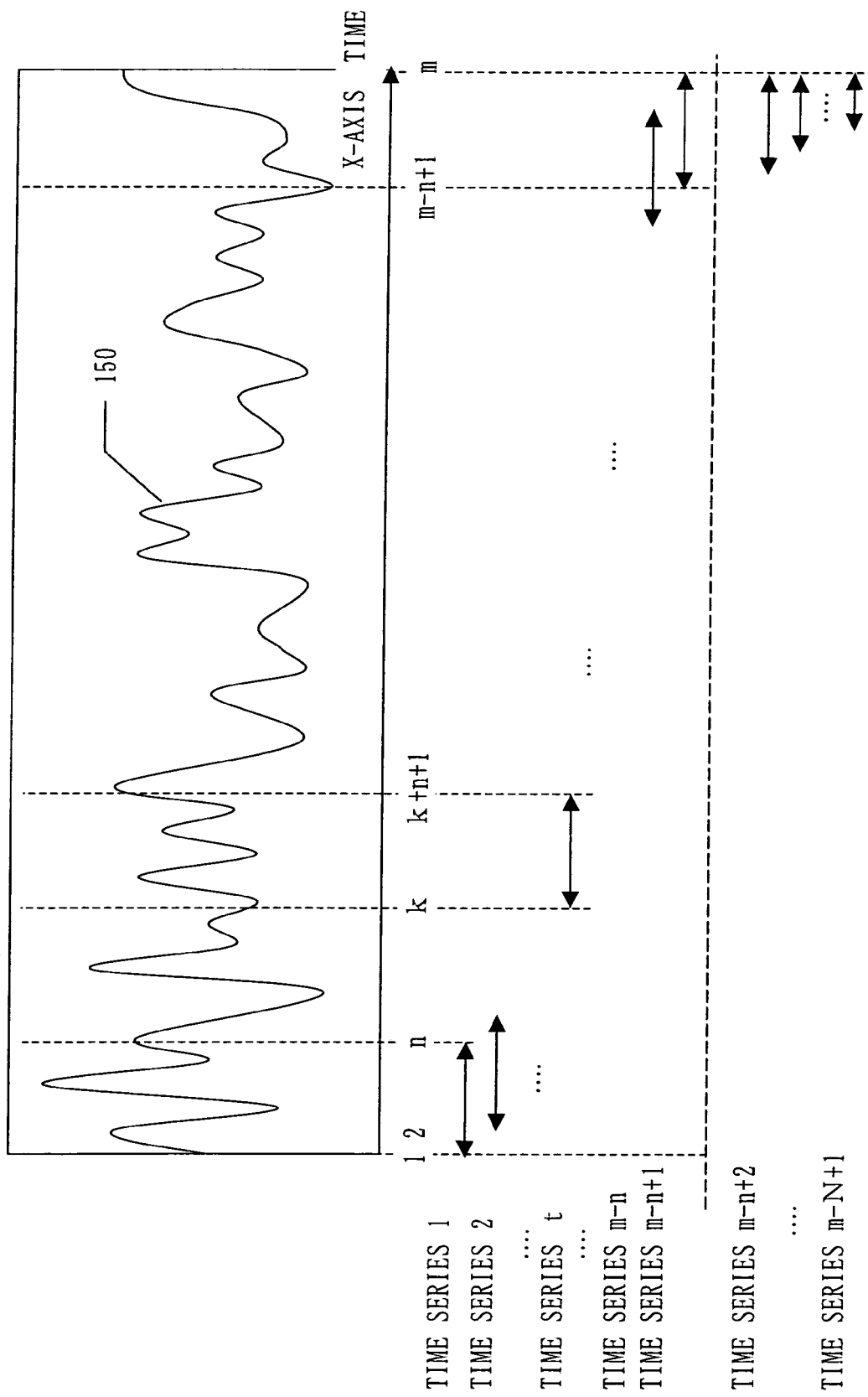
FIG. 3 is a diagram illustrating a method of generating time series data 151.

FIG. 3 is a diagram illustrating a method of generating the time series data 151. The time series data generating section 110 reads the time series source data 150 from the time series source data storage section 120, and generates m−n+1 pieces of time series of length n by sliding the time t of the start point of the time series source data by one at a time. It is assumed here that the length n is predetermined. A time series starting at t=1 is denoted by time series 1, a time series starting at t=2 is time series 2, and a time series starting at t=m−n+1 is time series m−n+1. The end point of the time series starting at t=m−n+1 is t=m. The length of a time series starting at a value of t after t=m−n+1 becomes less than n.

Further in consideration of a time series subsequence generation, n−N time series of length less than n and more than N are added thereafter. They are called supplemental time series whose values of the starting time t are between m−n+2 and m−N+1. The values of their end point t are m.

The length of a time series starting at m−n+2 is n−1.

The length of a time series starting at m−n+3 is n−2.

The length of a time series starting at m−N+1 is N.

Figure 4:
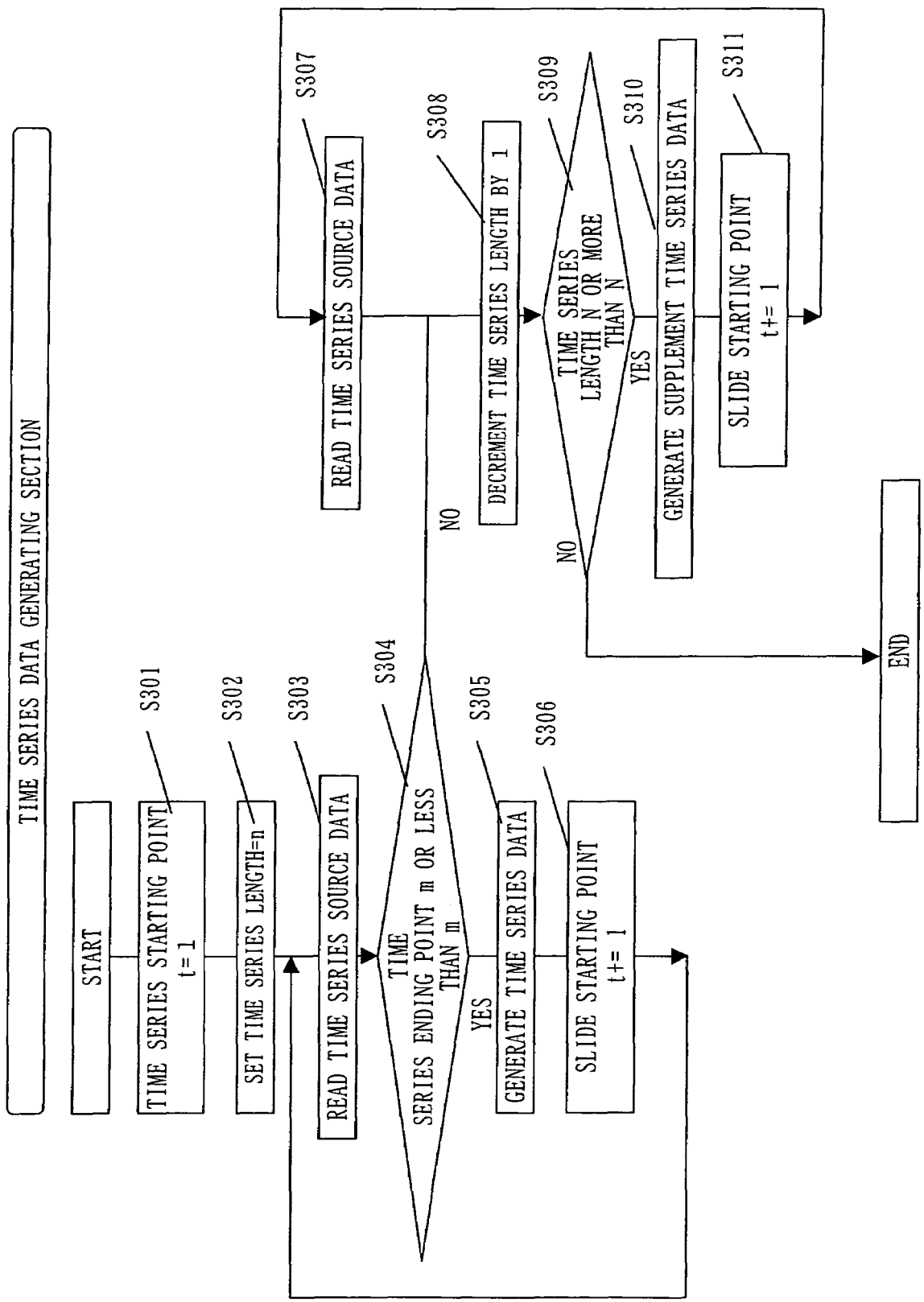
FIG. 4 is a flowchart illustrating how the time series data 151 is generated.

FIG. 4 is a flowchart illustrating how to generate the time series data 151. In S301, the starting time of time series data is set to t=1 of the time series source data. In S302, the length of the time series data is set to time series length=n. In S303, the time series source data is read. In S304, the time series end point is calculated based on the time series starting time and the time series length to check if it is m or less than m. If the time series end point is m or less than m, then the time series data can be generated, so that the process proceeds to S305. In S305, time series data is generated from the time series source data based on the time series starting time and the time series length. In S306, the start point t is incremented for generating another time series data, and the process proceeds back to S303 again. If it is found in S304 that the time series end point is over m, the time series data of time series length n cannot be generated any more, so that the process proceeds to S308 for generating supplemental time series data. In S308, the time series length is decremented. In S309, it is checked whether the time series length is N or more than N by the decrement. If the time series length is N or more than N, then the process proceeds to S310. In S310, the supplemental time series data is generated. In S311, the start point is incremented for the preparation of another supplemental time series data generation, and then the process proceeds to S307. In S307, the time series source data is read. The process then proceeds to S308 again. In S309, if the time series length is less than N, then the process of time series data generation terminates.

Figure 5:
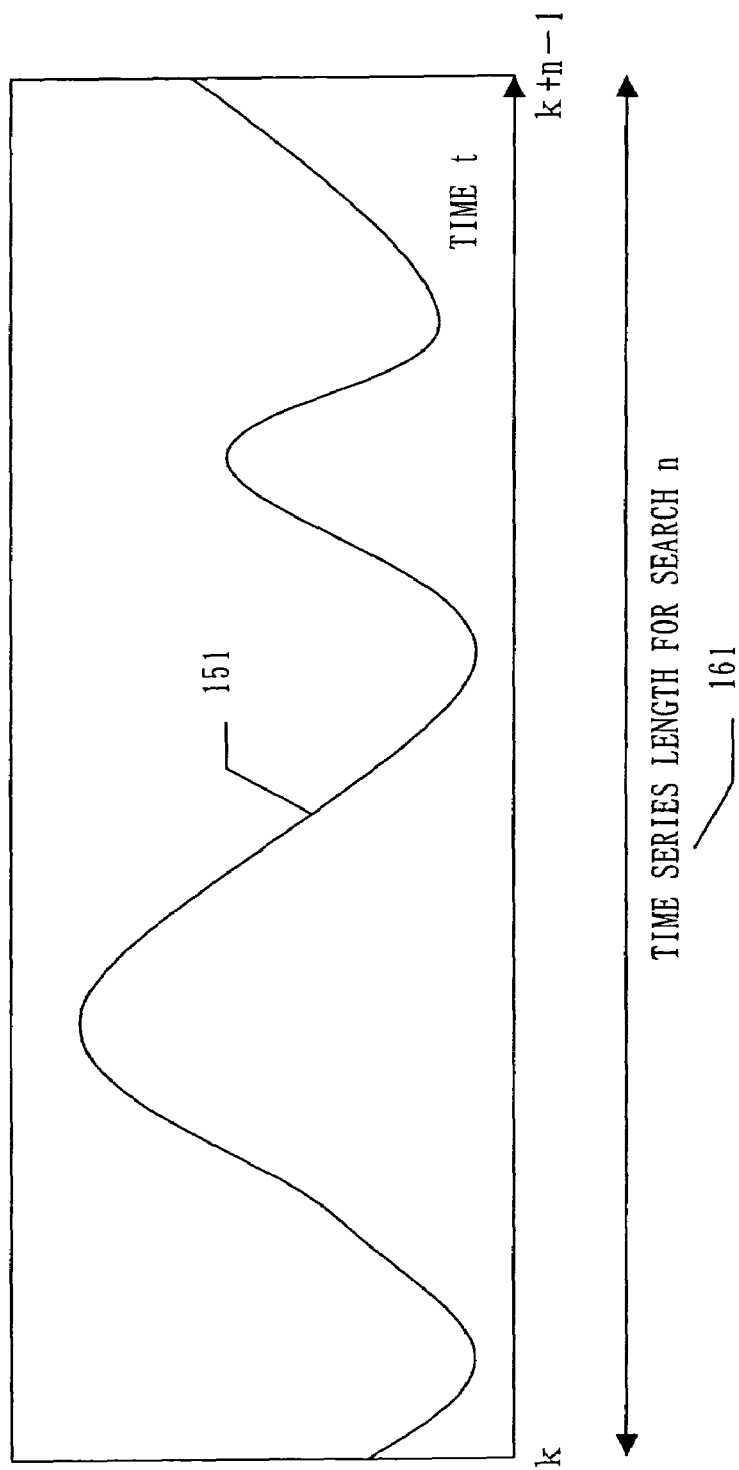
FIG. 5 is a graph of the time series data 151.

FIG. 5 is a graph of the time series data 151 where the start point is k, the end point is k+n−1, and there are n data points. The time series data 151 is a time series of length n (time series length for search 161).

Figure 6:
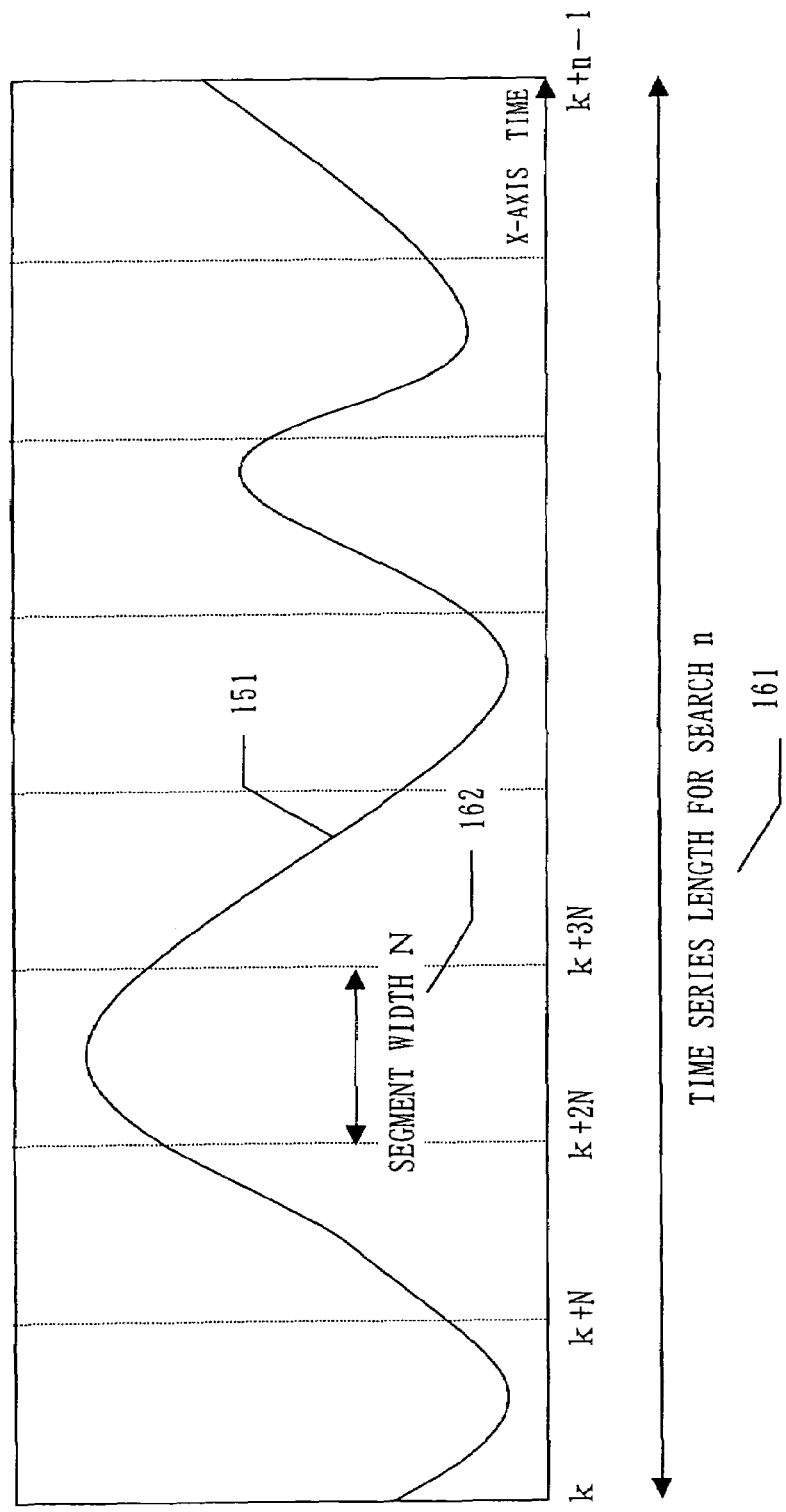
FIG. 6 shows time series data divided into segments.

FIG. 6 shows the time series data divided into segments. Each piece of the time series data 151 is divided into segments of length N (segment width 162). A piece of the time series data 151 is divided into n/N segments. Each segment of length N is referred to as the time series subsequence 152.

Figure 7:
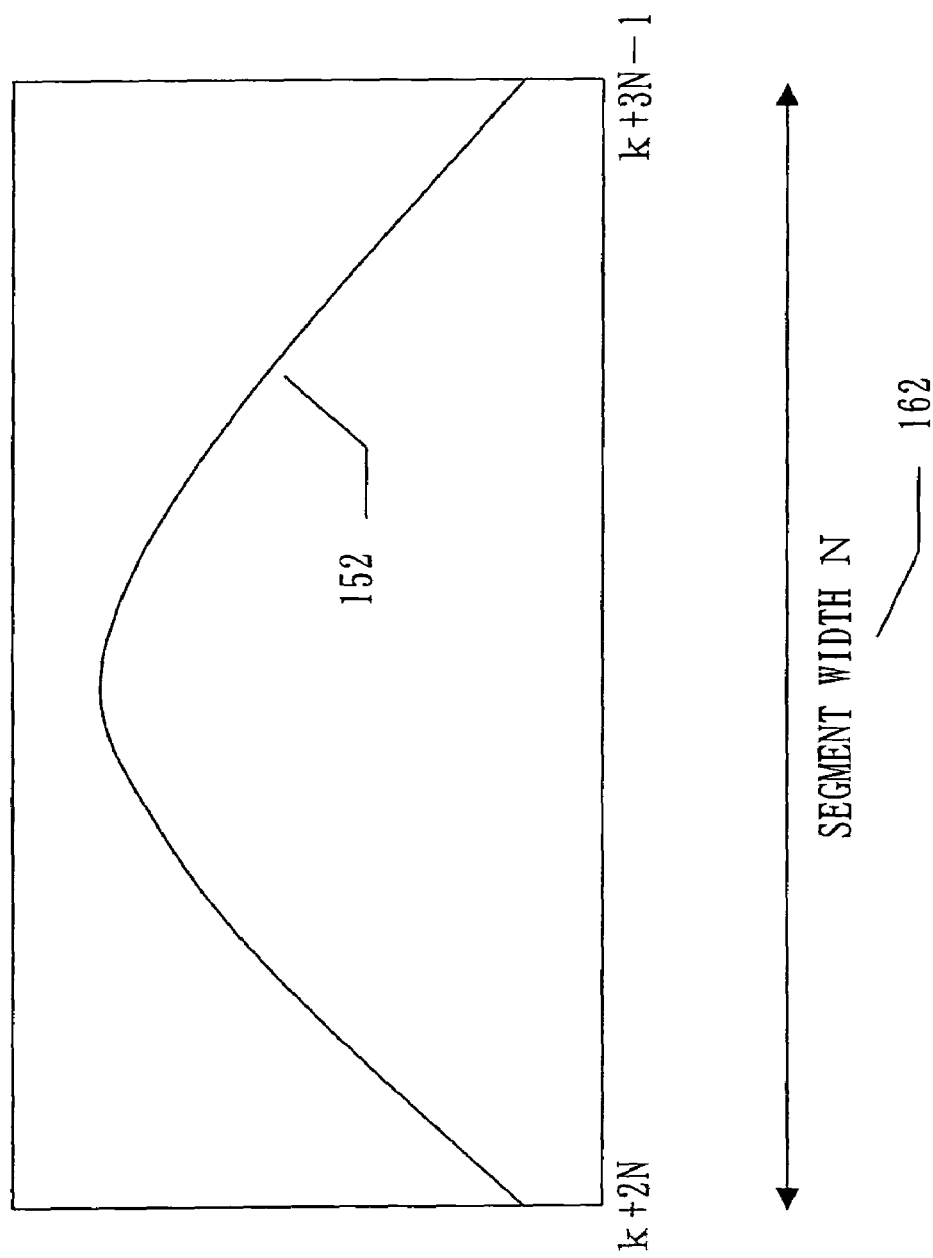
FIG. 7 shows a time series subsequence 152 when start point t=k+2N.

FIG. 7 shows the time series subsequence 152 when start point t=k+2N. The time series subsequence 152 contains N data points and the length is N.

The time series subsequence generating section 112 selects the first N pieces of data of each piece of the time series data 151 to generate the time series subsequence 152. This is done for all pieces of the time series to generate time series subsequences of length N whose start points are from t=1 to t=m−n+1. The time series subsequence generating section 112 also reads the first N pieces of data of the supplemental time series generated by the time series data generating section 110, and generates supplemental time series subsequence data. The time series subsequences and the supplemental time series subsequence data are stored in the time series subsequence memory section 122. It is assumed here that the segment width N is predetermined. This makes it possible to generate all the time series subsequences of length N with the start points from t=1 to t=m−N+1 from the time series source data.

Since all pieces of the time series data are derived from a single piece of the time series source data 150, every segment of the respective pieces of the time series data matches one of the time series subsequences.

Figure 8:
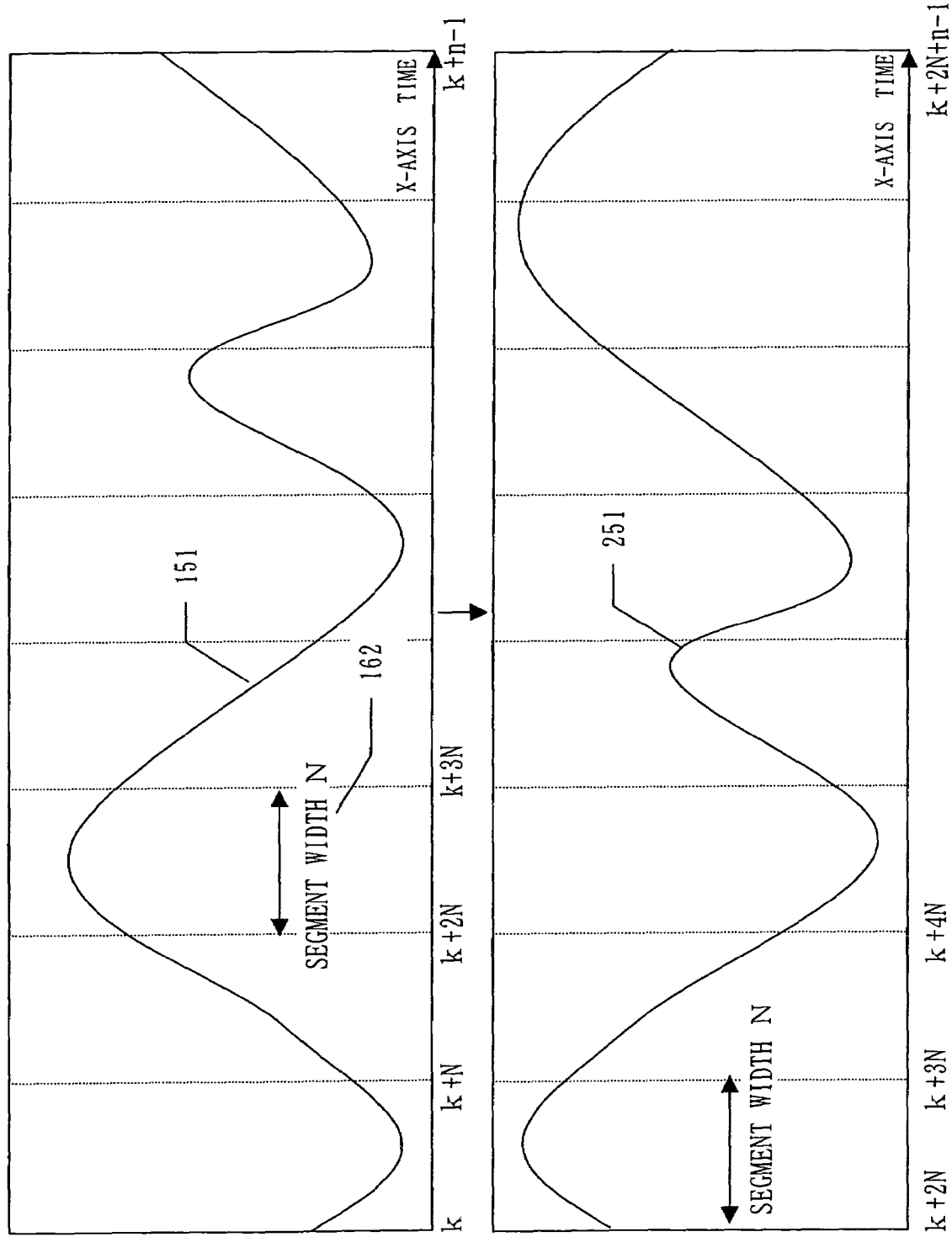
FIG. 8 shows the time series 151 starting at k and a time series 251 starting at k+2N.

As shown in FIG. 8, the time series subsequence of the third segment of the time series data 151 starting at k is identical to the first segment of a time series 251 starting at k+2N. In other words, the time series subsequence of the third segment of the time series data 151 matches the time series subsequence generated from the time series 251.

The SVD processing section 113 reads the time series subsequence 152 from the time series subsequence generating section 112, and performs singular value decomposition of a matrix with m−N+1 rows and N columns.

Singular value decomposition is a well-known expression where an arbitrary m×n matrix Y is expressed by the product of three matrices of U, S, and V as expressed below.

$$Y = USV^T = [u_1, u_2, \ldots, u_r] \begin{bmatrix} s_1 & 0 & \cdots & 0 \\ 0 & s_2 & \ddots & \vdots \\ \vdots & \ddots & \ddots & 0 \\ 0 & \cdots & 0 & s_r \end{bmatrix} \begin{bmatrix} v_1^T \\ v_2^T \\ \vdots \\ v_r^T \end{bmatrix} =$$

$$s_1 u_1 v_1^T + s_2 u_2 v_2^T + \ldots + s_r u_r v_r^T$$

where r=rank(Y); $s_1, s_2, \ldots, s_r$ is the square root of a positive eigenvalue (a singular value) of $Y^T Y$ when $s_1 \geq s_2 \geq \ldots \geq s_r$; and $v_1, v_2, \ldots, v_r$ are the n-th vectors and correspond to proper vectors, of an eigenvalue, $s_1^2, s_2^2, \ldots, s_r^2$, of $Y^T Y$. The $v_1, v_2, \ldots, v_r$ are 1 in size and orthogonal to one another. The $u_1, u_2, \ldots, u_r$ are the m-th vectors and defined by $$u_j = \frac{1}{s_j} Y v_j (j = 1, 2, \ldots, r)$$

where U is an m×r matrix with columns $u_1, u_2, \ldots, u_r$; V is an n×r matrix with columns $v_1, v_2, \ldots, v_r$; and S is the r-th diagonal matrix with diagonal elements, $s_1, s_2, \ldots, s_r$.

FIG. 9 shows the content of the SVD result memory section showing a singular value decomposition result. Singular value decomposition is used to extract the $u_1 s_1$ as the representative value of each row. More specifically, with a matrix with m−N+1 rows and N columns to be processed by singular value decomposition, the product of the r-th element of the vector $u_1$ and $s_1$ is used as a representative value for the r-th row in the row direction.

The r-th row is a time series subsequence when start point t=r, and its representative value is the product of the r-th element of the vector u1 and s1. The SVD processing section generates the representative values of all segments (all time series subsequences).

The dimensional compression time series data generating section 114 generates dimensional compression time series data by using the first element of singular value decomposition as the representative value of each segment. The time series data 151 when start point t=k includes the following time series subsequences:

Start point t=k, k+N, k+2N, . . . .

Therefore, the first representative value of the dimensional compression time series data is the product of the k-th element of the vector u1 and s1. The next representative value is the product of the k+N-th element of the vector u1 and s1.

Figure 10:
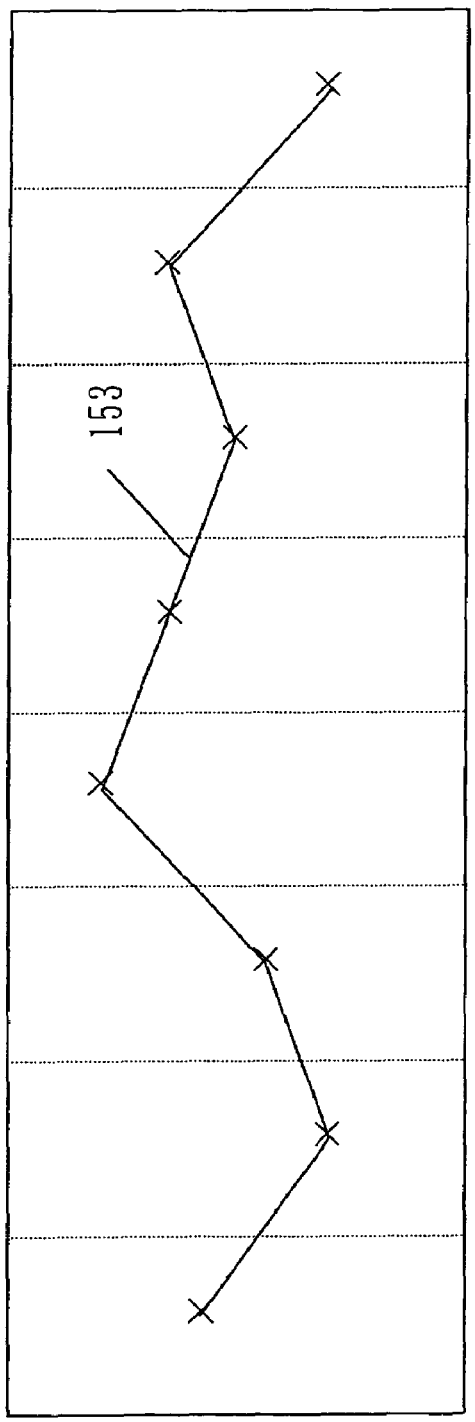
FIG. 10 is a graph of dimensional compression time series data 153 with plotted representative values.

FIG. 10 is a graph of the dimensional compression time series data 153 with the representative values being plotted.

The dimensional compression time series data 153 includes n/N points. The time series subsequences obtained by dividing the time series data 151 into segments are processed by SVD to obtain elements. The graph gives plots of the first elements thereof.

Figure 11:
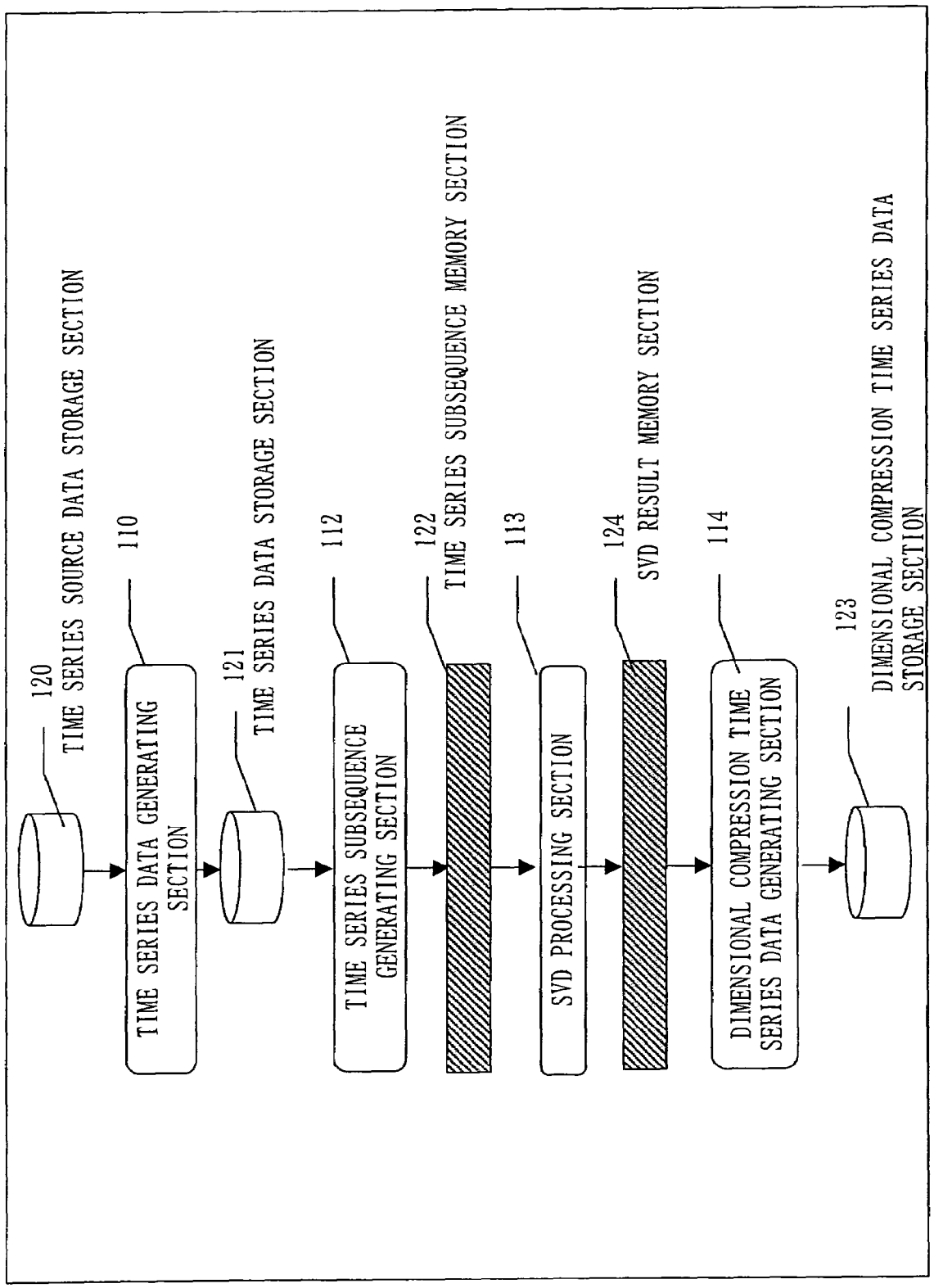
FIG. 11 is a flowchart illustrating how compression data is generated.

FIG. 11 is a flowchart illustrating how to generate compressed data. The time series data generating section 110 reads the time series source data 150 from the time series source data storage section 120, generates the time series data 151, and stores it in the time series data storage section 121. The time series subsequence generating section 112 reads the time series data 151 sequentially from the time series data storage section 121, generates the time series subsequence 152, and stores it in the time series subsequence memory section 122. The SVD processing section 113 reads time series subsequences from the time series subsequence memory section 122, performs singular value decomposition, and stores a result in the SVD result memory section 124. The dimensional compression time series data generating section 114 generates the dimensional compression time series data 153 by using the data of the SVD result memory section 124, and stores it in the dimensional compression time series data storage section 123.

The time series data dimensional compression apparatus that is characterized by including the following means is thus described: means for generating a plurality of pieces of time series data of the specified length by sliding the start point of time series data at the predetermined interval along the time axis on the sequential data measured at the regular interval along the time axis; means for generating time series subsequences of the specified segment width by which each of the plurality of pieces of time series data of the specified length is divided; means for performing singular value decomposition on all of the divided time series subsequences; means for using the specified number of high-order elements of the singular value decomposition (up to the first element in this particular case) as the representative value of each of the divided time series subsequences of the specified segment width; means for compressing the dimension of the time series data of the specified length by combining the representative values.

Embodiment 2

Figure 12:
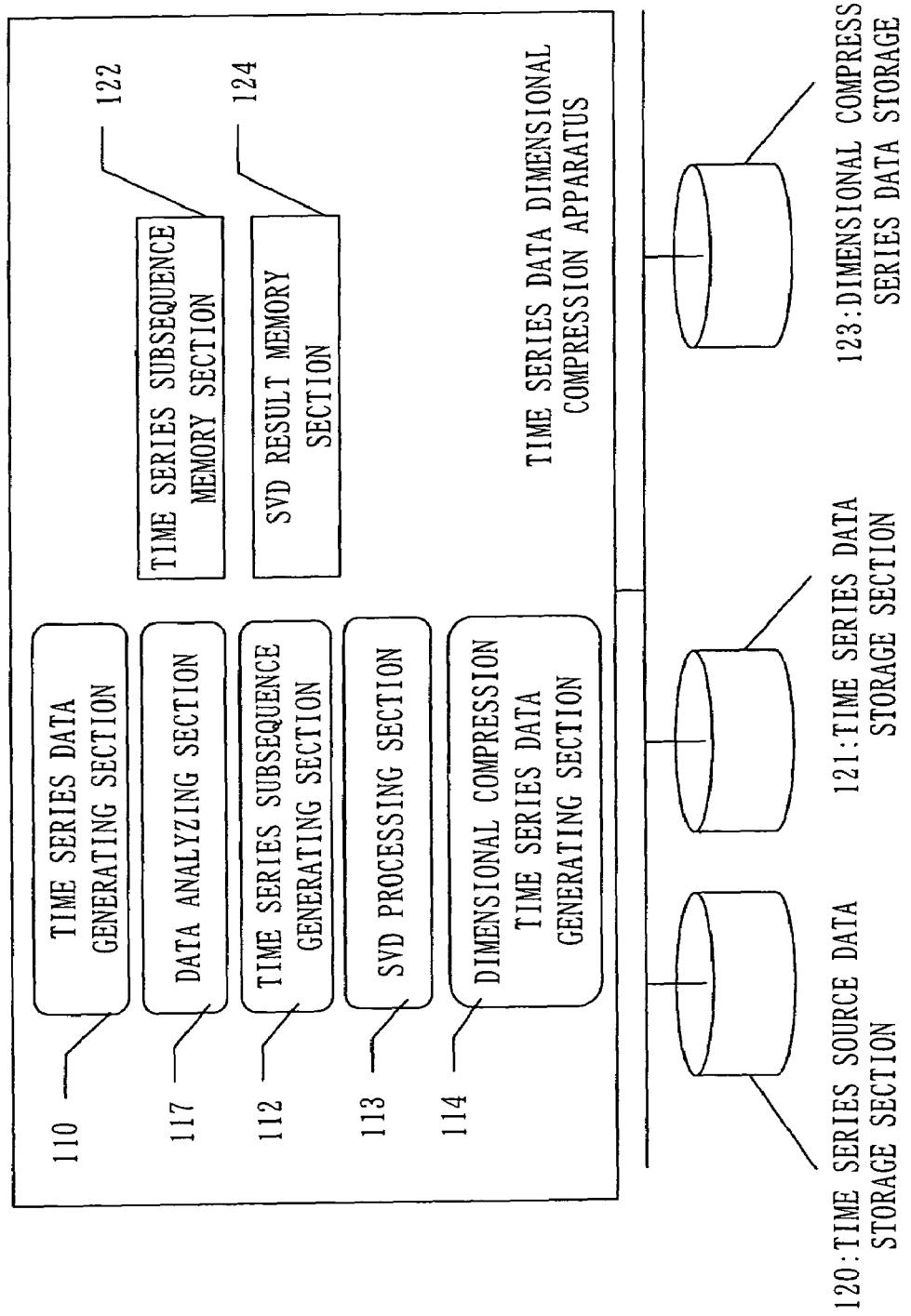
FIG. 12 is a block diagram illustrating a second embodiment of the present invention.

FIG. 12 is a block diagram illustrating a second embodiment of the present invention. Referring to the figure, reference numerals 110, 112, 113, 114, 120, 121, 122, 123, and 124 denote elements similar to those carrying the same numerals in FIG. 1. A data analyzing section 117 reads the time series data 151 from the time series data storage section 121, analyzes the data, and determines a segment width and an element of a singular value decomposition result up to which the singular value decomposition result is valid.

Figure 13:
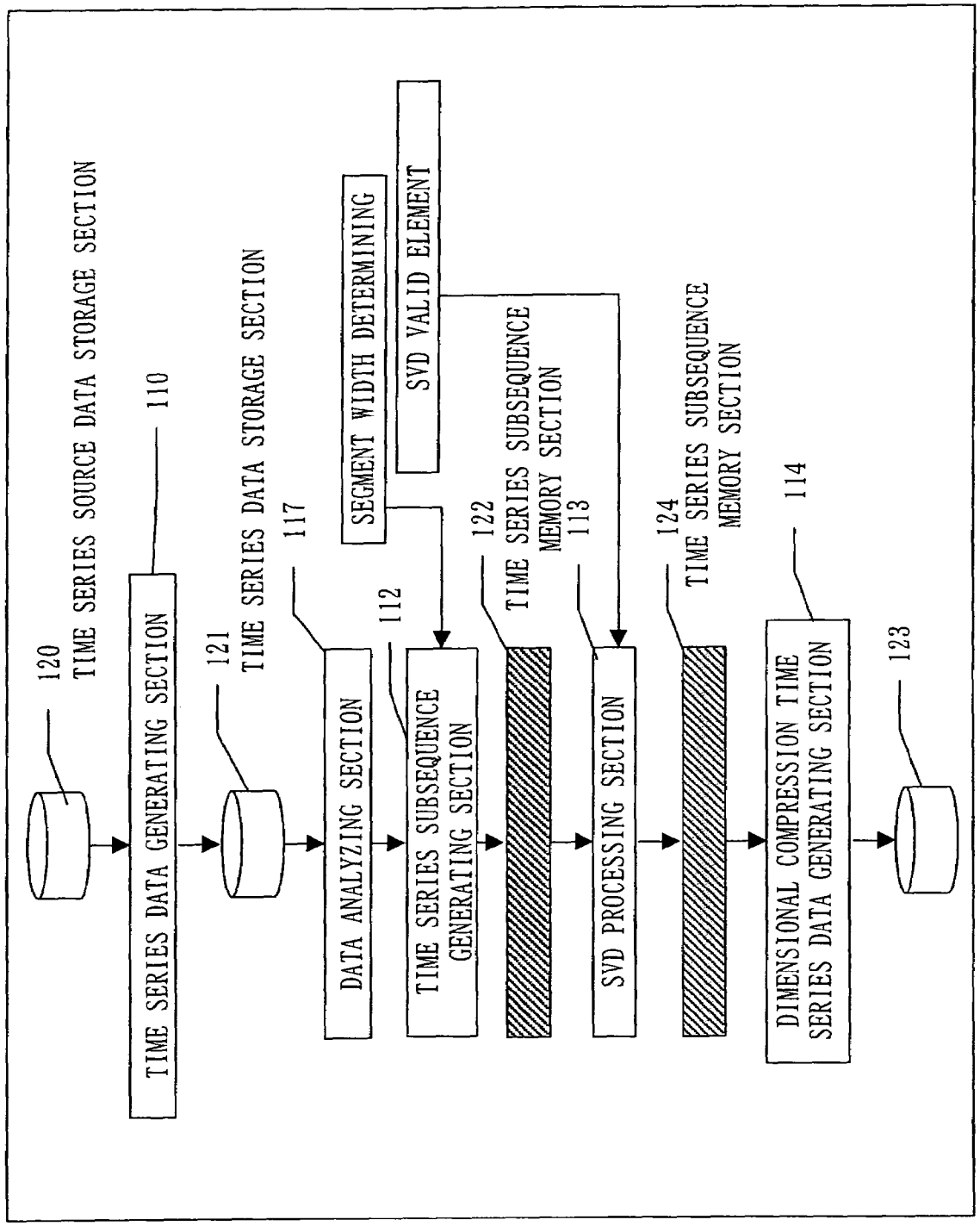
FIG. 13 is a flowchart of the second embodiment.

FIG. 13 is a flowchart of the second embodiment. The time series data generating section 110 reads the time series source data 150 from the time series source data storage section 120, generates the time series data 151, and stores it in the time series data storage section 121.

Next, the data analyzing section 117 reads the time series data from the time series data storage section 121 and analyzes it. As a result of analysis, the data analyzing section 117 determines a segment width and an element of a singular value decomposition result up to which the singular value decomposition result is valid in order to have the highest hit rates in searches. With this particular case, the result is used up to the second element.

The time series subsequence generating section 112 reads the time series data 151 sequentially from the time series data storage section 121, generates the time series subsequence 152, and stores it in the time series subsequence memory section 122. As the segment width of the time series subsequence, a value determined by the data analyzing section 117 is used. Next, the SVD processing section 113 reads the time series subsequence from the time series subsequence memory section 122, and processes it by singular value decomposition. As a result of singular value decomposition, an SVD result is stored in the SVD result memory section up to the value determined by the data analyzing section 117 about the element of the SVD result up to which the result is to be used. With this particular case, the SVD result is stored up to the second element in the SVD result memory section. The dimensional compression time series data generating section 114 generates the dimensional compression time series data 153 by using the content of the SVD result memory section, and stores it in the dimensional compression time series data storage section 123.

Figure 14:
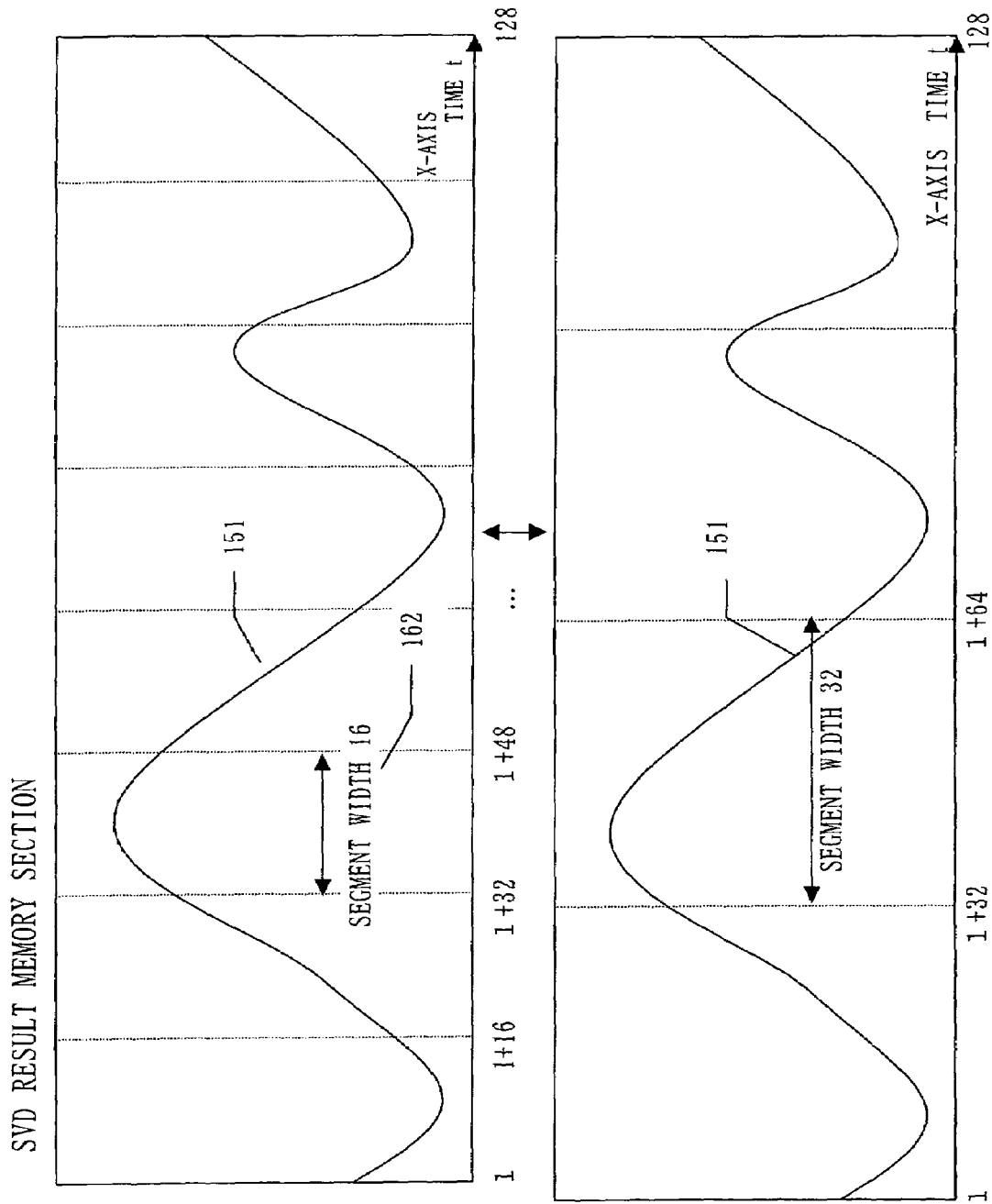
FIG. 14 shows pattern diagrams when segment widths are 16 and 32.

FIG. 14 shows pattern diagrams when the segment widths are 16 and 32. When the segment width is 16 and the SVD result is used up to the first element, a dimension after compression is obtained as follows: Number of Segments 128÷16=8, Segment Representative Value=1, Number of Segments×Segment Representative Value=8. That is, compression is done to the 8-th dimension.

When the segment width is 32, and the SVD result is used up to the second element, a dimension after compression is obtained as follows: Number of Segments 128÷32=4, Segment Representing Value=2, Number of Segments×Segment Representing Value=8. That is, compression is done to the 8-th dimension.

There are several choices of how to determine the segment width and the segment representative value when using the same dimension after compression. It is the function of the data analyzing section 117 to determine the segment width and the number of the segment representative value such that the highest hit rate is achieved among the choices.

FIG. 15 shows the content of the SVD result memory section when the SVD result is used up to the second element. When the values of the first elements of all segments are almost the same, then the segment width may be made wider and the SVD result may be used up to the second element. This makes it possible to extract the features of time series data more accurately, thereby improving the hit rate in searches.

The time series data dimensional compression apparatus of claim 1 including the following means is thus described: means for analyzing the time series data, and determining the segment width by which the time series data is divided, and an element from the singular value decomposition up to which the singular value decomposition is used as the representative value of a time series subsequence.

Thus, according to this invention, SVD is performed on divided segments, so that the feature of each segment may be extracted in comparison to all other data. This allows generation of compressed data with high search efficiency. Faster performance of SVD may also be achieved than when SVD is performed solely because of the matrix with the same number of rows but N/n columns.

Embodiment 3

Figure 16:
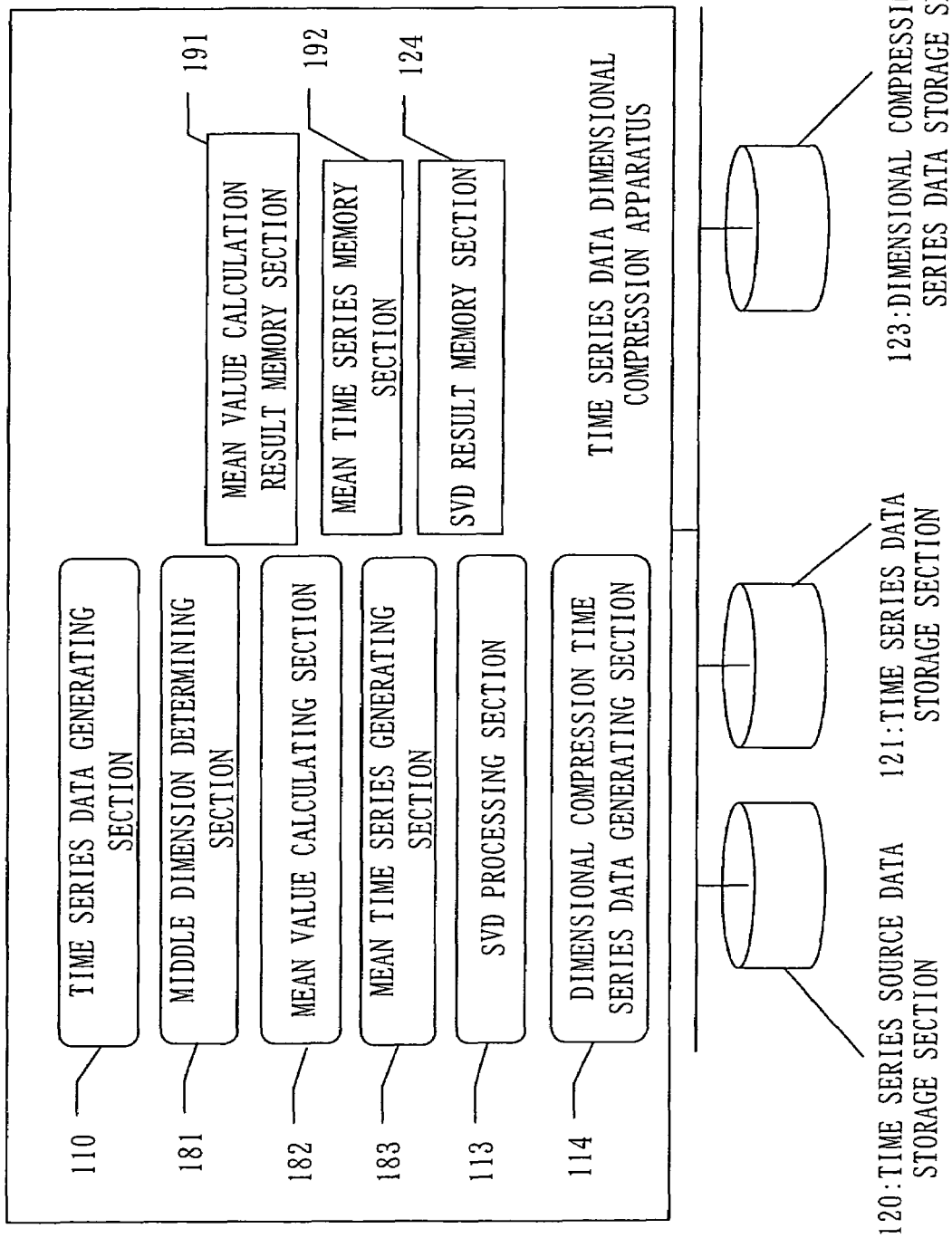
FIG. 16 is a block diagram illustrating a third embodiment of the present invention.

FIG. 16 is a block diagram illustrating an embodiment of this invention. Referring to the figure, reference numerals 110, 114, 120, 121, 123, and 124 denote elements similar to those discussed in FIG. 1 with the same numerals. An intermediate dimension determining section 181 determines a width to calculate a mean value. A mean value calculating section 182 calculates a mean value of time series data in the width for mean value specified by the intermediate dimension determining section, and stores a result in a mean value calculation result memory section 191. An intermediate time series generating section 183 generates an intermediate time series 155 by using the representative value of the width for mean value as its mean value, and stores the intermediate time series in an intermediate time series memory section 192. The SVD processing section 113 performs singular value decomposition in the intermediate time series memory section 192.

The intermediate dimension determining section 181 reads and analyzes time series source data, and determines an intermediate dimension p and a segment width to take a mean value. The width to take the mean value is within a range where time series data increases or decreases monotonously.

Figure 17:
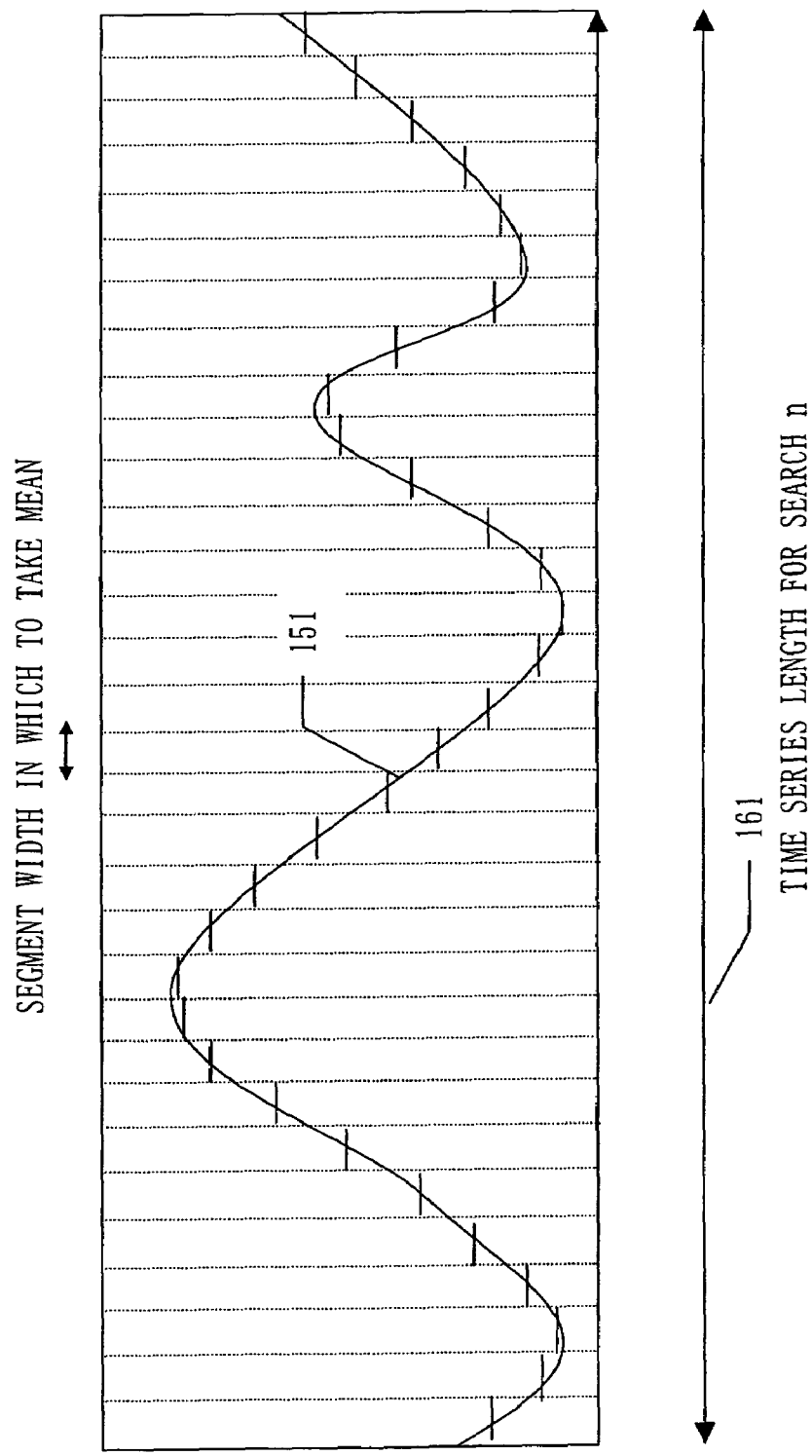
FIG. 17 shows a pattern diagram illustrating a calculation result by a mean value calculating section 182.

FIG. 17 shows a pattern diagram of a calculation result by the mean value calculating section 182. When the length of the time series data 151 is n, and the intermediate dimension is p, then a segment width to take the mean value becomes n/p. When a time series length is 128 and the intermediate dimension is 32, for example, then the segment width to take the mean value becomes 128/32=4. The mean value calculating section 182 calculates the mean value of the time series source data 150 for each data point by sliding the starting time t one by one, and stores a result in the mean value calculation result memory section 191.

Figure 18:
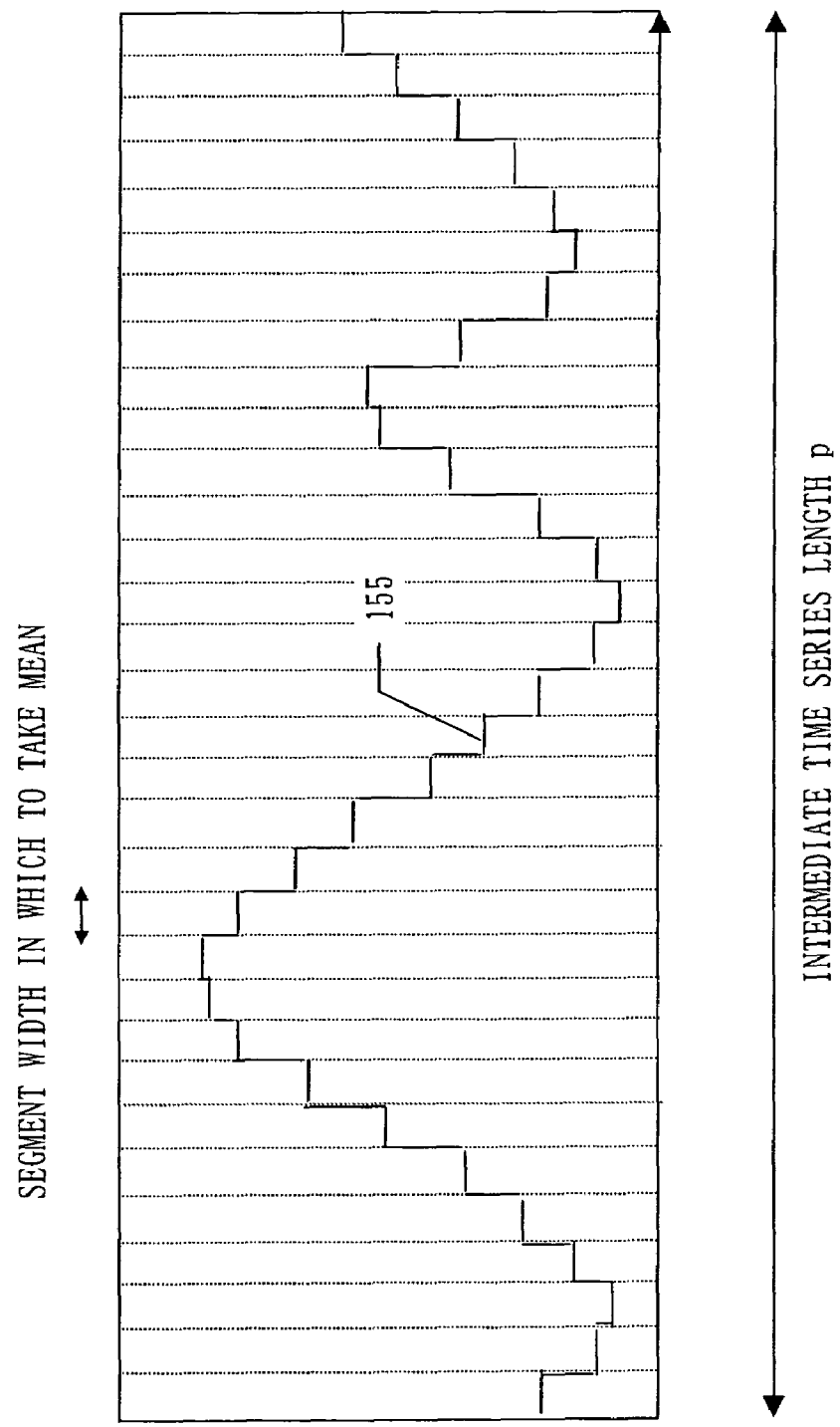
FIG. 18 is a graph of an intermediate time series.

FIG. 18 is a graph showing the intermediate time series. The intermediate time series generating section 183 decomposes each time series 151 by the segment width to take the mean value, retrieves the representative values of segments from the content of the mean value calculation result memory section 191, generates the intermediate time series 155 and stores it in the intermediate time series memory section 192.

FIG. 19 shows the content of the SVD result memory section 124 when the 8-th dimension is used as the dimension after compression. The SVD processing section 113 reads the intermediate time series 155 from the intermediate time series memory section 192, performs singular value decomposition of a matrix with m−n+1 rows and p columns, and stores a result in the SVD result memory section 124. In order to have the 8-th dimension after compression, the result is stored up to the value of the 8-th element.

Next, the dimensional compression time series data generating section 114 generates dimensional compression time series data by using the singular value decomposition result up to the 8-th element. More specifically, the dimensionally compressed time series data is generated by an approximately expression of each time series 151 using the following eight pieces of data:

$(s_1 u_1, s_2 u_2, s_3 u_3, s_4 u_4, s_5 u_5, s_6 u_6, s_7 u_7, s_8 u_8)$.

The time series data dimensional compression system that is characterized by including the following means is thus described: means for determining the segment width to take the mean for the plurality of pieces of time series data of the specified length; means for calculating the mean value of the time series for each segment width to take the mean; means for generating the intermediate time series by using the mean value as the segment representative value; means for performing the singular value decomposition on each intermediate time series; and means for using the specified number of high-order elements of the singular value decomposition as compressed data of the intermediate time series.

Thus, according to this invention, the mean value is taken in the width within which time series data varies monotonously, so that the amount of data may be reduced without losing the features of data. Furthermore, fast singular value decomposition may be achieved on a reduced amount of data and the features of data may also be extracted.

The time series data dimensional compression apparatus is a computer. Therefore it is possible to implement every element thereof by a program. It is also possible to store the program in a storage medium, so that the program is read by a computer from the storage medium.

Figure 20:
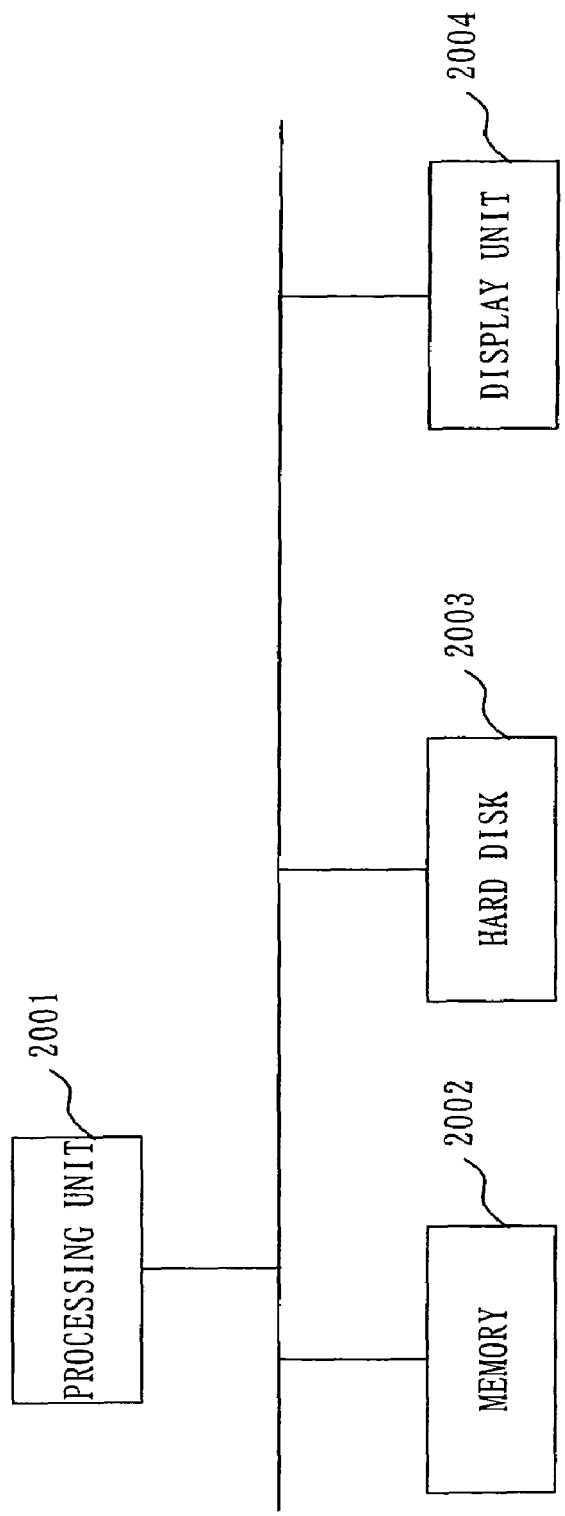
FIG. 20 is a diagram illustrating a hardware configuration.

FIG. 20 is a block diagram of a hardware configuration of the time series data dimensional compression apparatus. With this example, a processing unit 2001, a memory 2002, a hard disk 2003, and a display unit 2004 are connected to a bus. A program is stored in the hard disk 2003, for example. The program, when loaded in the memory 2002, is read by the processor 2001 sequentially to perform an operation.

INDUSTRIAL APPLICABILITY

Dimensional compression for better search efficiency for time series data may be achieved without losing the features of data. The compression is made to a determined dimension so that more pieces of information may be extracted therein.

The invention claimed is:

1. A time series data dimensional compression apparatus, comprising:
   (1) a time series data generating section that generates a plurality of pieces of time series data of a specified length by sliding a start point of time series data at a predetermined interval along a time axis on time series source data that is sequential data measured at a regular interval along the time axis;
   (2) a time series subsequence generating section that generates time series subsequences of a specified segment width by which each of the plurality of pieces of time series data is divided;
   (3) a singular value decomposition processing section that performs singular value decomposition on all of the divided time series subsequences; and
   (4) a dimensional compression time series data generating section that generates dimensional compression time series data by using a specified number of high-order elements of the singular value decomposition as a representative value of each of the divided time series subsequences of the specified segment width.

2. The time series data dimensional compression apparatus of claim 1, wherein a dimension of the time series data of the specified length is compressed by combining representative values.

3. The time series data dimensional compression apparatus of claim 1, further comprising:
   a data analyzing section that analyzes the time series data, and determines the segment width by which the time series data is divided, and an element from the singular value decomposition up to which the singular value decomposition is used as the representative value of a time series subsequence.

4. A time series data dimensional compression apparatus, comprising:
   (1) a time series data generating section that generates a plurality of pieces of time series data of a specified length by sliding a start point of time series data at a predetermined interval along a time axis on time series source data that is sequential data measured at a regular interval along the time axis;
   (2) an intermediate dimension determining section that determines a segment width to take a mean for each of the plurality of pieces of time series data of the specified length;
   (3) a mean value calculating section that calculates a mean value of the time series for the segment width to take the mean;
   (4) an intermediate time series generating section that generates an intermediate time series by using the mean value calculated as a segment representative value;
   (5) a singular value decomposition processing section that performs the singular value decomposition on each intermediate time series; and
   (6) a dimensional compression time series data generating section that uses a specified number of high-order elements of the singular value decomposition as compressed data of the intermediate time series.

* * * * *